United States Patent
Tanaka et al.

(10) Patent No.: US 7,468,282 B2
(45) Date of Patent: Dec. 23, 2008

(54) TUNNELING MAGNETORESISTIVE ELEMENT, SEMICONDUCTOR JUNCTION ELEMENT, MAGNETIC MEMORY AND SEMICONDUCTOR LIGHT EMITTING ELEMENT

(75) Inventors: Hidekazu Tanaka, Suita (JP); Tomoji Kawai, Minoo (JP)

(73) Assignee: Japan Science and Technology Agency, Saitama (JP)

( * ) Notice: Subject to any disclaimer, the term of this patent is extended or adjusted under 35 U.S.C. 154(b) by 0 days.

(21) Appl. No.: 11/979,584

(22) Filed: Nov. 6, 2007

(65) Prior Publication Data

US 2008/0085567 A1 Apr. 10, 2008

Related U.S. Application Data

(62) Division of application No. 10/505,942, filed as application No. PCT/JP03/03604 on Mar. 25, 2003, now Pat. No. 7,309,903.

(30) Foreign Application Priority Data

Mar. 26, 2002 (JP) .............................. 2002-086928

(51) Int. Cl.
H01L 29/82 (2006.01)
(52) U.S. Cl. .......................... 438/3; 257/425; 257/427; 257/295; 257/E21.665; 257/421
(58) Field of Classification Search ................ 257/295, 257/421, 425, 427, E21.665; 438/3
See application file for complete search history.

(56) References Cited

U.S. PATENT DOCUMENTS

| | | | |
|---|---|---|---|
| 4,784,702 A * | 11/1988 | Henri | ........................ 136/258 |
| 5,416,353 A | 5/1995 | Kamiguchi et al. | |
| 5,962,905 A | 10/1999 | Kamiguchi et al. | |
| 6,445,024 B1 | 9/2002 | Kwon et al. | |
| 6,456,523 B1 | 9/2002 | Tanaka et al. | |
| 6,509,621 B2 * | 1/2003 | Nakao | ........................ 257/421 |
| 6,594,120 B2 | 7/2003 | Odagawa et al. | |
| 6,597,548 B1 | 7/2003 | Yamanaka et al. | |
| 6,670,660 B2 | 12/2003 | Hosotani | |
| 7,164,180 B2 | 1/2007 | Yoshida et al. | |
| 2001/0031547 A1 | 10/2001 | Ohno et al. | |
| 2003/0026048 A1 | 2/2003 | Yamanaka et al. | |

FOREIGN PATENT DOCUMENTS

EP 0 710 735 A1 5/1996

(Continued)

OTHER PUBLICATIONS

Extended Abstracts (The 49th Spring Meetings, 2002); The Japan Society of Applied Physics and Related Societies, Mar. 27, 2002-Mar. 30, 2004, JSAP Catalog No. AP 021108-00.

(Continued)

*Primary Examiner*—Eugene Lee
(74) *Attorney, Agent, or Firm*—Harness, Dickey & Pierce PLC

(57) ABSTRACT

A pin junction element includes a ferromagnetic p-type semiconductor layer and a n-type semiconductor layer which are connected via an insulating layer, and which shows a tunneling magnetic resistance according to the magnetization of the ferromagnetic p-type semiconductor layer and the magnetization of the ferromagnetic n-type semiconductor layer. In this pin junction element, an empty layer is formed with an applied bias, thereby generating tunnel current via an empty layer. As a result, it is possible to generate tunnel current even when adopting a thicker insulating layer than that of the conventional tunnel magnetic resistance element.

4 Claims, 14 Drawing Sheets

FOREIGN PATENT DOCUMENTS

| | | |
|---|---|---|
| JP | 05-211348 | 8/1993 |
| JP | 10-186011 A | 7/1998 |
| JP | 11-274597 | 10/1999 |
| JP | 11-354859 A | 12/1999 |
| JP | 2001-85763 A | 3/2001 |
| JP | 2001-352113 | 12/2001 |
| JP | 2004-022904 | 1/2004 |

OTHER PUBLICATIONS

Makoto Kohda et al., "A Spin Esaki Diode", Jpn. J. Appl. Phys. vol. 40 (2001) pp. L 1274-L 1276, Part 2, No. 12A, Dec. 1, 2001.

C. Mitra et al., "$p$-$n$ diode with hole-and electron-doped lanthanum manganites", Applied Physics Letters, vol. 79, No. 15, Oct. 8, 2001, pp. 2408-2410.

Y. Ohno et al., "Electrical spin injection in a ferromagnetic semiconductor heterostructure", Macmillan Magazines Lt, vol. 402, Dec. 16, 1999, pp. 790-792.

Hidekazu Tanaka et al., "Giant Electric Field Modulation of Double Exchange Ferromagnetism at Room Temperature in the Perovskite Manganite/Titanate $p$-$n$ Junction", Physical Review Letters, vol. 88, No. 2, Jan. 14, 2002, pp. 027204-027204-4.

* cited by examiner

TUNNELING MAGNETORESISTIVE ELEMENT, SEMICONDUCTOR JUNCTION ELEMENT, MAGNETIC MEMORY AND SEMICONDUCTOR LIGHT EMITTING ELEMENT

This application is a Divisional Application of U.S. application Ser. No. 10/505,942, filed Sep. 24, 2004, now U.S. Pat. No. 7,309,903, which is a 371 application of International Application No. PCT/JP03/03604, filed Mar. 25, 2003, claiming the benefit under 35 U.S.C. §119 of Japanese Application No. 2002-86928, filed Mar. 26, 2002, the entire contents of all of which are hereby incorporated herein by reference in their entirety.

TECHNICAL FIELD

The present invention relates to a tunneling magnetoresistive element which shows tunneling magnetoresistance, a semiconductor junction element which generates tunnel current with an application of a backward bias, a magnetic memory including such tunneling magnetoresistive element and a semiconductor junction element, and a semiconductor light emitting element which emits light with an application of a forward bias.

BACKGROUND ART

In recent years, in addition to a semiconductor element which controls the flow of electrons, spintronics (which may be referred to as spinelectronics, magnetoelectronics or spinics) for controlling the spin as a source of magnetism by the semiconductive method has been developing. With the development of such spintronics, a practical application of a MRAM (Magnetic Random Access Memory), a novel light emitting element, etc., has been expected.

The MRAM which stores data magnetically is expected as a next generation memory, as the MRAM has such beneficial characteristics as nonvolatile, high data writing speed, which is difficult to be realized by the conventional semiconductor memory (DRAM, SRAM, EEPROM).

FIG. 15(a) and FIG. 15(b) are conceptual diagrams illustrating the structure of a conventional MRAM. In this MRAM, a tunneling magnetoresistive (TMR: Tunneling Magnetoresistance) element is adopted. A TMR element 50 includes a very thin layer (insulative layer 53) of insulative substance of only a few atoms thick, which is interposed between two magnetic layers (a first magnetic layer 51 and a second magnetic layer 52). In this TMR element 50, electric resistance changes according to magnetization directions of the first magnetic layer and the second magnetic layers 51 and 52.

For example, when current is applied to the TMR element 50 in the direction shown in FIG. 15(a), in an electric wire 54 on the side of the TMR element 50, a magnetic field is generated to the right in FIG. 15(a), and is magnetized in the direction of the magnetic field generated by the first magnetic layer 51 of the TMR element 50. Incidentally, the magnetization direction of the second magnetic layer 52 is set to the right in FIG. 15(a), and not to be changed by the current flowing in the electric wire 54. In this state, current becomes more smoothly flow in the thin insulative layer 53 by the tunneling effect, and the resistance value of the TMR element 50 is lowered accordingly.

On the other hand, when current is applied to the TMR element 50 in the direction shown in FIG. 15(b), in the electric wire 54 on the side of the TMR element 50, a magnetic field is generated to the left in FIG. 15(b), and is magnetized in the direction of the magnetic field generated by the first magnetic layer 51 of the TMR element 50. In this state, current becomes difficult to flow in the thin insulative layer 53, and the resistance value of the TMR element 50 is increased accordingly.

By utilizing the foregoing changes in resistance (TMR effect), data can be stored in the TMR element 50, for example, by setting the state of FIG. 15(a) as "0", and the state of FIG. 15(b) as "1".

On the other hand, for a novel light emitting element, the development of such element that can control the polarization state of light as desired has been expected. For example, for the observation of the spinning state of the substance, a circularly polarized light is adopted. Conventionally, this circularly polarized light is obtained, for example, as a radiation from a circular accelerator of the synchrotron-type, or by making a linearly polarized light pass through a predetermined filter. However, such circular accelerator has a large scale structure, and the device which makes the light pass through the filter also has a relatively complicated structure. It is therefore preferable to obtain a circularly polarized light by means of a single element. The generation of such circularly polarized light is reported, for example, in the Nature vol. 402 16 Dec. 1999 pp. 790-792.

FIG. 16 is a cross-sectional view illustrating the structure of the element article. This element is arranged so as to include an n-type GaAs substrate 61, an n-type GaAs buffer 62, GaAs 63, an (In, Ga)As quantum well 64, a GaAs spacer 65 and a p-type GaMnAs 66 which are laminated in this order. With respect to this element, by applying the magnetic field B parallel to the magnetization easy axis of the p-type GaMnAs 66 to apply current I, the spin polarized positive hole h+reaches the (In, Ga) As quantum well 64 via the non-magnetic GaAs spacer 65, and is reconnected to the electron which is not spin polarized at the (In, Ga) As quantum well 64, and the element emits a circularly polarized lightσ+ as being reconnected to the electrons of the non-spin polarized electrons.

However, the foregoing conventional technique has the following problems.

Firstly, with regard to MRAM shown in FIG. 15(a) and FIG. 15(b), it is required to form an extremely thin insulative layer 53 in the TMR element 50 to obtain an appropriate TMR effect. For this reason, the conditions for forming the TMR element 50 become very strict, which hinder the practical applications.

For the element shown in FIG. 16, as the light emitted therefrom has a low degree of polarization, and it is not possible to be uses as a light emitting element which emits a circularly polarized light. Incidentally, the foregoing article does not aim to generate a circularly polarized light. In this element of FIG. 16, it is necessary to arrange so as to generate a circularly polarized light at low temperatures, i.e., at 50 K or below.

The present invention is achieved in finding a solution to the foregoing problem, and the first object of the present invention is to provide an element which offers an appropriate TMR effects. It is an second object of the present invention to provide an element which emits a circularly polarized light with a high degree of polarization.

DISCLOSURE OF INVENTION

In order to solve the foregoing problem, the magnetoresistive element in which a first ferromagnetic layer and a second ferromagnetic layer are connected via an insulative layer, and which shows a tunneling magnetoresistance according to a magnetization of the first ferromagnetic layer and a magnetization of the second ferromagnetic layer, is arranged such that the first ferromagnetic layer is a p-type semiconductor, and the second ferromagnetic layer is an n-type semiconductor.

According to the foregoing arrangement, the pin junction is formed by the first ferromagnetic layer which is a p-type semiconductor, the insulative layer, and the second ferromagnetic layer which is the n-type semiconductor. With this structure, an empty layer is formed with an applied backward bias, and a tunnel current can be generated via this empty layer.

According to the conventional tunneling magnetoresistive element, the magnetic layer is conductive, and therefore the tunneling effect can be achieved only from the structure wherein the insulative layer is formed extremely thin, i.e., only a few atoms thick. In contrast, according to the above structure of the present invention, the tunneling effect can be obtained even when the insulative layer is formed relatively thick.

Therefore, according to the foregoing structure, the control precision required for the process of forming the insulative layer is not as high as that required for the insulative layer of the conventional tunneling magnetoresistive element. Namely, as compared to the conventional tunneling magnetoresistive element, the tunneling magnetoresistive element can be manufactured in a simpler manner.

The magnetic memory in accordance with the present invention includes the tunneling magnetoresistive element, wherein information is recorded according to the magnetization of the first ferromagnetic layer and the magnetization of the second ferromagnetic layer.

According to the foregoing structure which adopts the tunneling magnetoresistive element that can be manufactured with ease for the magnetic memory, it is also possible to manufacture the magnetic memory with ease.

The semiconductor junction element in accordance with the present invention in which a p-type semiconductive layer and an n-type semiconductive layer are connected via an insulative layer, and which generates a tunnel current with an applied backward bias, is arranged such that both the p-type semiconductive layer and the n-type semiconductive layer are ferromagnetic members.

According to the foregoing arrangement, the pin junction is formed by the first ferromagnetic layer which is a p-type semiconductor, the insulative layer, and the second ferromagnetic layer which is an n-type semiconductor. With this structure, an empty layer is formed with an applied backward bias, and a tunnel current can be generated via this empty layer.

Here, both the p-type semiconductive layer and n-type semiconductive layer are ferromagnetic members. Therefore, it is possible to control the magnetization of the p-type semiconductive layer and the magnetization of the n-type semiconductive layer with an applied external magnetic field. As a result, it is possible to control the tunneling magnetoresistance of the tunneling current, thereby permitting the semiconductor junction element to be adopted as the tunneling magnetoresistive element.

By utilizing this semiconductor junction element as the tunneling magnetoresistive element, it is possible to generate the tunnel current without forming adopting an extremely thin insulative layer, i.e., only a few atoms thick as required in the conventional tunneling magnetoresistive element. As a result, it is possible to adopt as a tunneling magnetoresistive element, the semiconductor junction element that can be manufactured in a simpler manner as compared to a conventional magnetoresistive element.

The semiconductor junction element in accordance with the present embodiment having the foregoing structure is arranged such that the p-type semiconductive layer is made of $(La, Ba)MnO_3$.

By adopting $(La, Ba)MnO_3$ for the p-type semiconductor layer, it is possible to make the p-type semiconductor function both as the p-type semiconductor and as a layer of the ferromagnetic member relatively at high temperature and also at room temperature.

The semiconductor junction element in accordance with the present invention having the foregoing structure of the semiconductor junction element is arranged such that the insulative layer is made of $SrTiO_3$.

In the case of adopting the p-type semiconductive layer made of $(La,Ba) MnO_3$, by adopting the insulative layer made up of $SrTiO_3$, it is possible to make the p-type semiconductive layer function as the layer of the ferromagnetic member at still higher temperatures.

The semiconductor junction element in accordance with the present invention having any of the foregoing structures is arranged such that the insulative layer includes unit cells of the $SrTiO_3$ in its thickness direction, the insulating layer being formed in a thickness of 500 Å or thinner. According to the foregoing arrangement, the tunnel current can be generated with ease.

The semiconductor junction element in accordance with the present invention having any of the foregoing structures is arranged such that the n-type semiconductive layer is made of $(Ti, Co)O_2$.

By adopting $(Ti, Co)O_2$ for the n-type semiconductor layer, it is possible to make the n-type semiconductive layer function both as the n-type semiconductor and the layer in the ferromagnetic member at relatively high temperatures and even at room temperature.

The semiconductor junction element in accordance with the present invention in which a p-type semiconductive layer and an n-type semiconductive layer are connected, and which generates a tunnel current with an applied backward bias, is arranged such that both the p-type semiconductive layer and the n-type semiconductive layer are ferromagnetic memories respectively.

According to the foregoing arrangement, the pn junction is formed by the p-type semiconductor layer and the n-type semiconductor layer. Then, with an applied backward bias, it is possible to form an empty layer, and the tunnel current can be generated via the empty layer.

Here, both the p-type semiconductive layer and n-type semiconductive layer are ferromagnetic members. Therefore, it is possible to control the magnetization of the p-type semiconductive layer and the magnetization of the n-type semiconductive layer with an applied external magnetic field. As a result, it is possible to control the tunneling magnetoresistance of the tunneling current, thereby permitting the semiconductor junction element to be adopted as the tunneling magnetoresistive element.

By utilizing this semiconductor junction element as the tunneling magnetoresistive element, it is possible to generate the tunnel current without forming adopting an extremely thin insulative layer, i.e., only a few atoms thick as required in the conventional tunneling magnetoresistive element. As a result, it is possible to adopt as a tunneling magnetoresistive element, the semiconductor junction element that can be manufactured in a simpler manner as compared to a conventional magnetoresistive element.

The magnetic memory in accordance with the present invention includes any one of the foregoing tunneling magnetoresistive elements, wherein information is recorded according to the magnetization of the p-type semiconductor layer and the magnetization of the n-type semiconductor layer. As described, by adopting the semiconductor junction element that can be manufactured in a simple manner as the tunneling magnetoresistive element, it is also possible to manufacture the magnetic memory with ease.

The semiconductor junction element in accordance with the present invention includes a (La,Ba) $MnO_3$ layer, a $SrTiO_3$ layer, and (Ti, Co)$O_2$ layer which are laminated in this order to form a heterojunction.

According to the foregoing arrangement, (La,Ba) $MnO_3$ layer can be functioned as the ferromagnetic p-type semiconductor, the $SrTiO_3$ layer can be functioned as the insulator, and the (Ti, Co)$O_2$ layer can be functioned as the ferromagnetic n-type semiconductor. As a result, it is possible to adopt as a tunneling magnetoresistive element, the semiconductor junction element that can be manufactured in a simpler manner as compared to a conventional tunnel magnetoresistive element.

The semiconductor junction element in accordance with the present invention having the foregoing structure is characterized in that the $SrTiO_3$ layer includes at least one unit cell of $SrTiO_3$ in its thickness direction, the $SrTiO_3$ layer being formed in a thickness of 500 Å or thinner. According to the foregoing arrangement, tunnel current is liable to be generated.

The semiconductor junction element in accordance with the present invention includes the (La,Sr) $MnO_3$ layer and the (Ti, Co)$O_2$ layer which are laminated to form a heterojunction.

According to the foregoing arrangement, the (La,Sr) $MnO_3$ layer can be functioned as the ferromagnetic p-type semiconductor, and the (Ti,Co)$O_2$ layer can be functioned as the ferromagnetic n-type semiconductor. As a result, it is possible to adopt as a tunneling magnetoresistive element, the semiconductor junction element that can be manufactured in a simpler manner as compared to a conventional magnetoresistive element.

The semiconductor junction element in accordance with the present invention having the foregoing structure is arranged so as to include the (La,Ba) $MnO_3$ layer and the (Ti, Co)$O_2$ layer which are laminated to form a heterojunction.

According to the foregoing arrangement, (La,Ba)$MnO_3$ layer can be functioned as a ferromagnetic p-type semiconductor, and the (Ti, Co)$O_2$ layer can be functioned as the ferromagnetic n-type semiconductor. As a result, it is possible to adopt as a tunneling magnetoresistive element, the semiconductor junction element that can be manufactured in a simpler manner as compared to a conventional magnetoresistive element.

In order to solve the foregoing problem, the semiconductor light emitting element in accordance with the present invention including the p-type semiconductive layer and the n-type semiconductive layer which are connected via an active layer, and which emits a light with an applied forward bias, is characterized in that both the p-type semiconductive layer and the n-type semiconductive layer are ferromagnetic members.

According to the foregoing arrangement, by setting the magnetization of the p-type semiconductive layer parallel to the magnetization of the n-type semiconductive layer, the positive hole and the electrons which are spin polarized in mutually parallel directions are reconnected with an applied forward bias, thereby generating a circularly polarized light.

In this case, since both the positive hole and the electrons are spin-polarized, a light with a high degree of polarization can be emitted. As a result, it is possible to realize a light emitting element which emits a circularly polarized light with a high degree of polarization.

For a fuller understanding of the nature and advantages of the invention, reference should be made to the ensuing detailed description taken in conjunction with the accompanying drawings.

BEST MODE FOR CARRYING OUT THE INVENTION

The following will explain one embodiment of the present invention in reference to FIG. 1 through FIG. 14.

Figure 2:
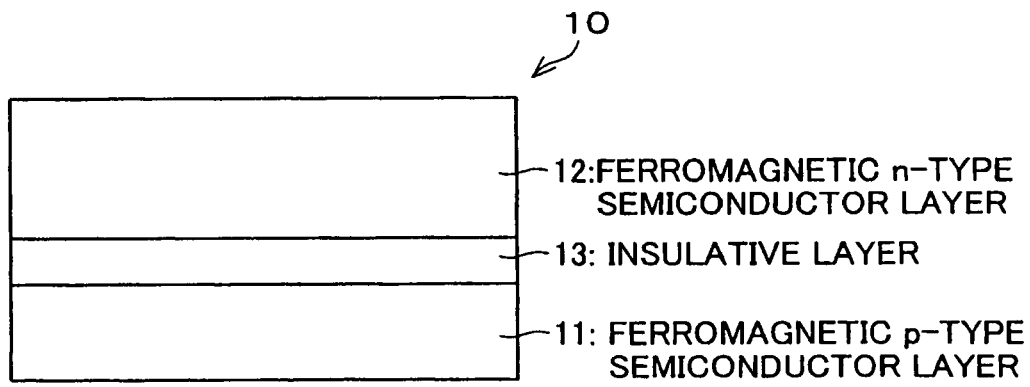
FIG. 2 is a cross-sectional view illustrating the structure of the pin junction element in accordance with the present invention.
Figure 3:
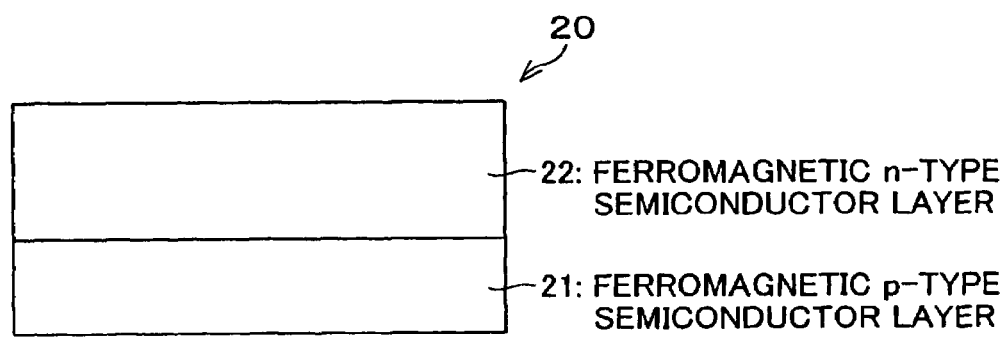
FIG. 3 is a cross-sectional view illustrating the structure of the pn junction element in accordance with the present invention.
Figure 4:
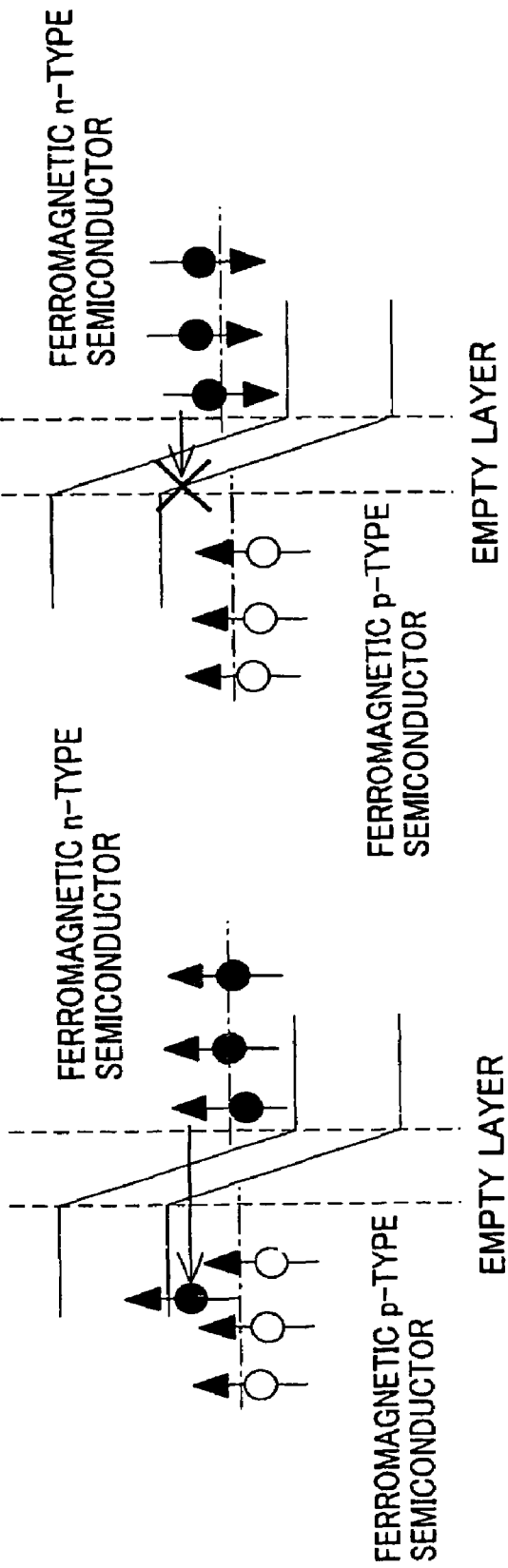
FIG. 4($a$) and FIG. 4($b$) are energy diagrams, respectively illustrating a low resistance state (ON state) and a high resistance state (OFF state) in the case of adopting the pin junction element of FIG. 2 or the pn junction element of FIG. 3 as the TMR element.

FIG. 2 is a cross-sectional view illustrating the structure of a pin junction element 10 (semiconductor junction element, tunneling magnetoresistive element) in accordance with the present invention. FIG. 3 is a cross-sectional view illustrating the structure of a pn junction element 20 in accordance with the present invention.

The pin junction element 10 includes an insulative layer 13 interposed between the ferromagnetic p-type semiconductive layer 11 (the first magnetic layer, the p-type semiconductive layer) and the ferromagnetic n-type semiconductive layer 12 (the second magnetic layer, the n-type semiconductive layer), and which respectively form a heterojunction (hetero structure). The pn junction element 20 (semiconductor junction element, tunneling magnetoresistive element) includes the ferromagnetic p-type semiconductive layer 21 (first magnetic layer, the p-type semiconductive layer) and the ferromagnetic n-type semiconductive layer 22 (second magnetic layer, the n-type semiconductive layer) which are laminated to form a heterojunction (hetero structure).

FIG. 4(a) and FIG. 4(b) are energy diagrams which respectively explain the cases where the pin junction element 10 of FIG. 2 or the pn junction element 20 of FIG. 3 is adopted as the TMR element. FIG. 4(a) and FIG. 4(b) are energy diagrams illustrating the low resistance state (ON state) and the high resistance state (OFF state), respectively.

According to the pin junction element 10, an empty layer is formed with an applied backward bias, and respective layers are connected so as to generate a tunnel current via the empty layer. Here, as illustrated in FIG. 4(a), by setting the magnetization of the ferromagnetic p-type semiconductive layer 11 parallel to the magnetization of the ferromagnetic n-type semiconductive layer 12, the spin polarization of a positive hole that is spin polarized in the ferromagnetic p-type semiconductive layer 11 and the spin polarization of an electron that is spin polarized in the ferromagnetic n-type semiconductive layer 12 also become parallel to one another. As a result, the TMR becomes relatively low. On the other hand, as illustrated in FIG. 4(b), in the case where the magnetization of the ferromagnetic p-type semiconductive layer 11 is set anti-parallel to the magnetization of the ferromagnetic n-type semiconductive layer 12, the spin polarization of a positive hole spin that is polarized in the ferromagnetic p-type semiconductive layer 11 and the spin polarization of an electron that is spin polarized in the ferromagnetic n-type semiconductive layer 12 also become anti-parallel to one another. As a result, the TMR becomes relatively high.

As described, data can be stored in the pin junction element 10, for example, by setting the state of FIG. 4(a) as "0", and the state of FIG. 4(b) as "1" as in the case of the conventional TMR element.

Figure 15:
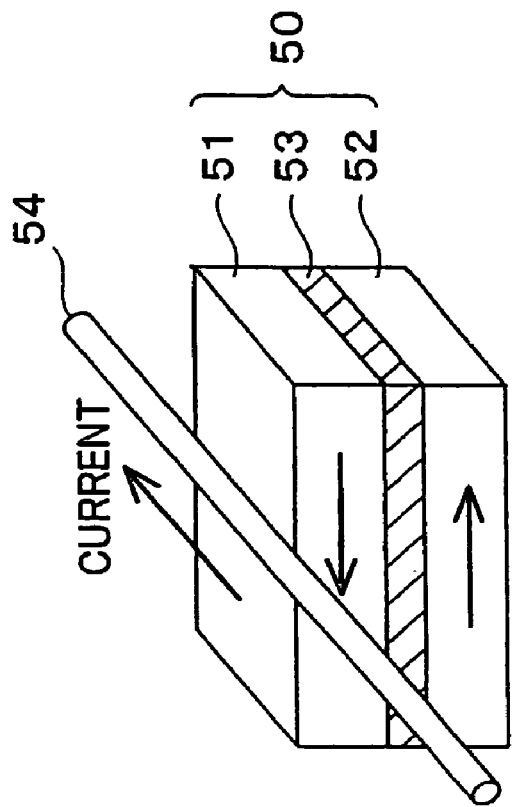
FIG. 15($a$) and FIG. 15($b$) are perspective views illustrating a conventional MRAM in the low resistance state (ON state), and in the high resistance state (OFF state).
Figure 15:
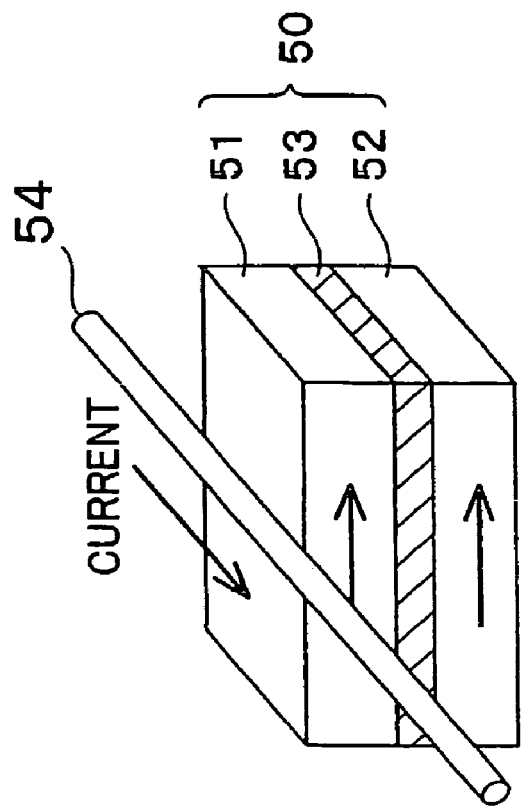
Figure 16:
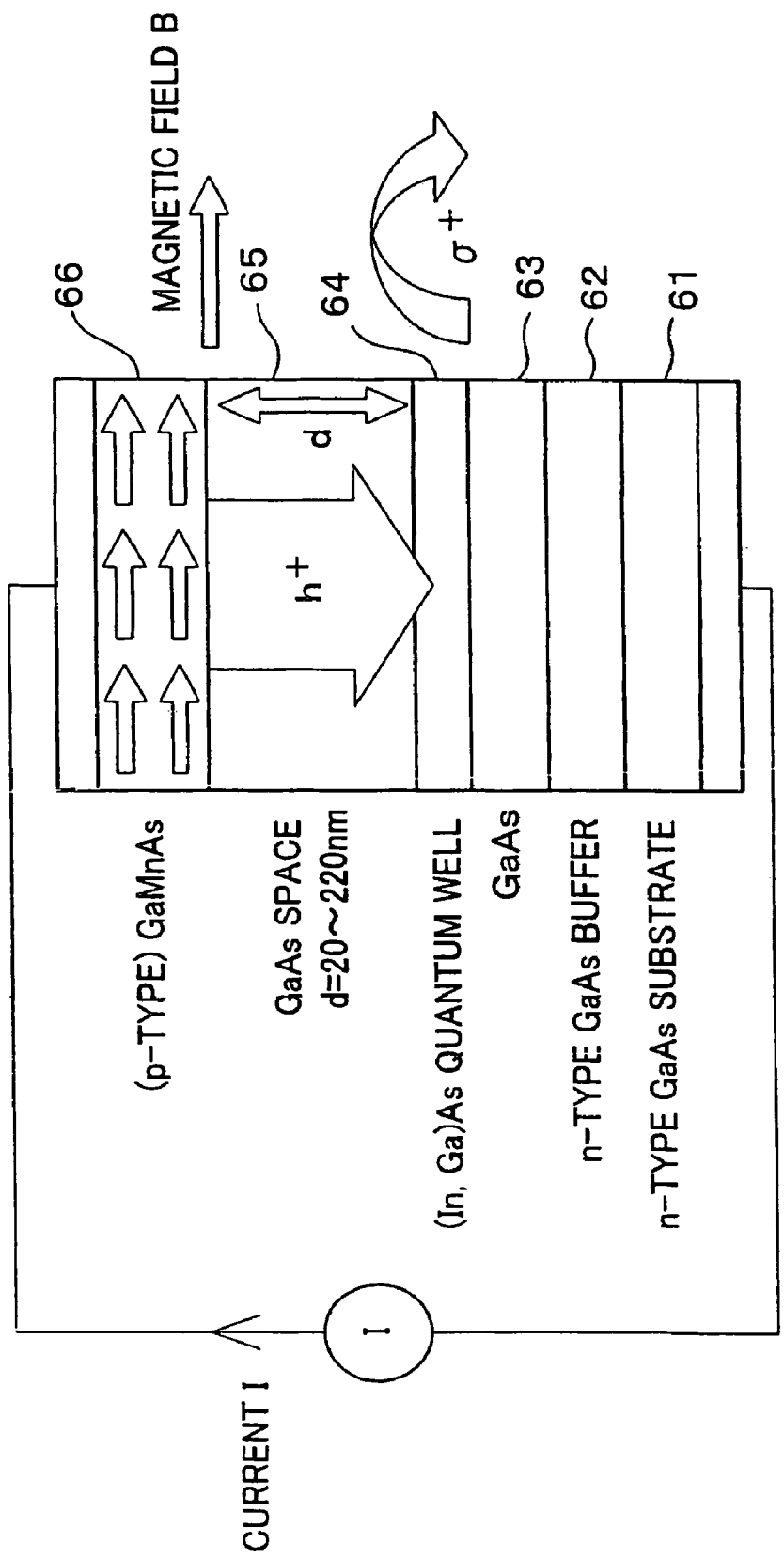
FIG. 16 is a cross-sectional view illustrating the structure of a conventional element which emits a circularly polarized light.

Here, the pin junction element 10 of the present embodiment differs from the conventional TMR element in that in the conventional TMR element 50 (see FIG. 15(a) and FIG. 15(b)), the tunneling effect can be achieved only from the structure wherein both the first magnetic layer 51 and the second magnetic layer 52 are conductive, and the insulative layer 53 is formed extremely thin, i.e., only a few atoms thick. In contrast, according to the pin junction element 10, the tunneling effect can be obtained even when the insulative layer 13 is formed relatively thick.

Therefore, to manufacture the conventional TMR element 50, a process to be controlled with high precision is required to form an extremely thin insulative layer 53 of only a few atoms thick. In contrast, the control precision required for the process of forming the insulative layer 13 of the pin junction element 10 is not as high as that required for the insulative layer 53. Namely, as compared to the conventional TMR element 50, the pin junction element 10 can be manufactured in a simpler manner, and is therefore more suited for mass production.

Incidentally, according to the pin junction element 10, it is possible to control a tunnel barrier with an application of bias. As a result, the amount of movement of charges by the TMR effect can be controlled by bias, and it is therefore possible to adjust the conditions to be suited for detecting changes in the TMR. This characteristic is also a beneficial characteristic of the pin junction element 10 which is difficult to be realized by the conventional TMR element 50.

As described, the pin junction element 10 (semiconductor junction element) in accordance with the present invention can be utilized as the TMR element, and the pin junction element 10 includes the first ferromagnetic layer (ferromagnetic p-type semiconductive layer 11, the p-type semiconductive layer), and the second ferromagnetic layer (ferromagnetic n-type semiconductive layer 12, n-type semiconductive layer) which are connected via the insulative layer 13, and shows the TMR according to the magnetization of the first ferromagnetic layer, and the magnetization of the second ferromagnetic layer, wherein the first ferromagnetic layer is the p-type semiconductor, and the second ferromagnetic layer is the n-type semiconductor.

For the first ferromagnetic layer, it is required to be functioned as a ferromagnetic member and as a p-type semiconductor at operating temperatures of the pin junction element 10, and it is desirable to be functioned as a ferromagnetic member and as a p-type semiconductor at or above room temperature (in the specification of the present application, room temperature indicates 298 K). Similarly, for the second ferromagnetic layer, it is required to be functioned as a ferromagnetic member and an n-type semiconductor at operating temperatures of the pin junction element 10, and it is desirable to be functioned as a ferromagnetic member and as a n-type semiconductor at or above room temperature.

Figure 5:
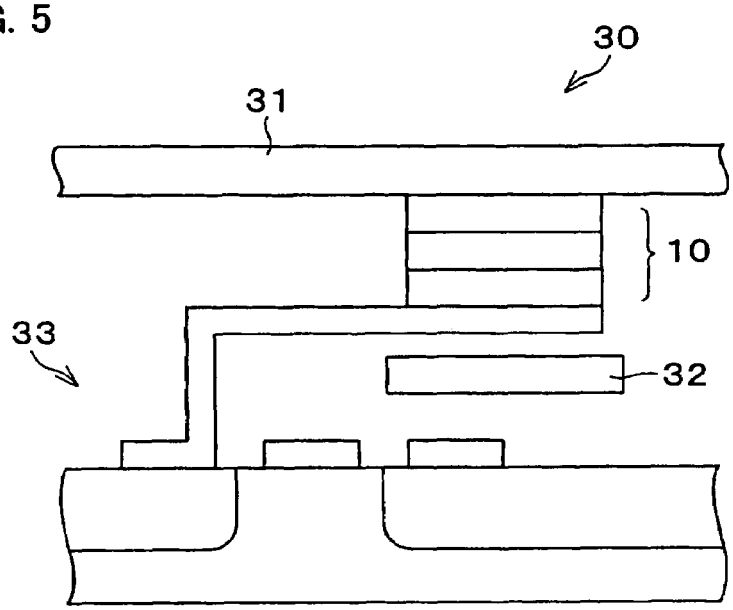
FIG. 5 is a cross-sectional view illustrating the schematic structure of an MRAM (magnetic memory) adopting the pin junction element of FIG. 2.

FIG. 5 is a cross-sectional view illustrating the schematic structure of an MRAM 30 (magnetic memory) adopting this pin junction element 10. In the foregoing structure, a plurality of bit lines 31 and word lines 32 are arranged so as to cross at right angles, and bit cells are formed at respective intersections between the plurality of bit lines 31 and the word lines 32. FIG. 5 shows the MRAM 30 for one bit.

For each cell, provided are one pin junction element 10 and one CMOS 33. Here, the pin junction element 10 is disposed between the bit line 31 and the word line 32. In this pin junction element 10, with an applied current both to the bit line 13 and the word line 32, the magnetization is inversed by a composite magnetic field generated by these current, thereby wiring data. On the other hand, when current is applied to only either one of the bit line 31 or the word line 32, a sufficient intensity of the magnetic field cannot be ensured, and writing cannot be performed. As described, in the MRAM 30, information are stored according to the magnetization of the ferromagnetic p-type semiconductive layer 11 and the magnetization of the ferromagnetic n-type semiconductive layer 12. Incidentally, the CMOS 33 is used for reading the data from the pin junction element 10. The foregoing structure of the MRAM 30 is explained merely as one example, and the pin junction element 10 is applicable to the MRAM of other structure.

In the foregoing example, explanations have been given through the case of the pin junction element 10; however, the pn junction element 20 may be equally used as the TMR element to constitute MRAM. Namely, in the pn junction element 20, the TMR effect can be obtained via an empty layer formed between the ferromagnetic p-type semiconductive layer 21 and the ferromagnetic n-type semiconductive layer 22. Incidentally, for the foregoing pn junction element 20, it is not necessary to form the insulative layer, and therefore the manufacturing process can be simplified.

As described, the pn junction element 20 (semiconductor junction element) in accordance with the present invention is arranged such that the p-type semiconductive layer (ferromagnetic p-type semiconductive layer 21) and the n-type semiconductive layer (ferromagnetic n-type semiconductive layer 22) are mutually connected, wherein with an applied backward bias, the tunnel current is generated, and both the p-type semiconductive layer and the n-type semiconductive layer are made of ferromagnetic members. Furthermore, the foregoing pn junction element 20 is capable of controlling electric transport characteristic (electric resistance) with an applied bias or the magnetic field.

For the p-type semiconductor layer, it is required to be functioned as a ferromagnetic member and as a p-type semiconductor at operating temperatures of the pn junction element 20, and it is desirable to be functioned as a ferromagnetic member and as a p-type semiconductor at or above room temperature. Similarly, for the n-type semiconductor layer, it is required to be functioned as a ferromagnetic member and as an n-type semiconductor at operating temperatures of the pn junction element 20, and it is desirable to be functioned as a ferromagnetic member and as an n-type semiconductor at or above room temperature.

Figure 6:
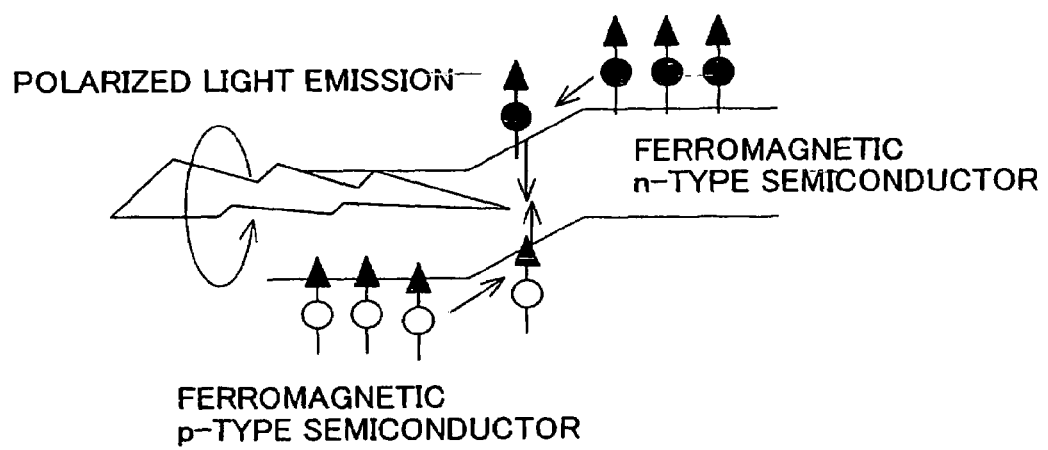
FIG. 6 is an energy diagram which explains the case of adopting the pin junction element of FIG. 2 as a light emitting element.

FIG. 6 is an energy diagram which explains the case wherein the pin junction element 10 of FIG. 2 is adopted as the light emitting element. When adopting the pin junction element 10 as the light emitting element, a forward bias is applied to the pin junction element 10. Here, by setting the magnetization of the ferromagnetic p-type semiconductive layer 11 parallel to the magnetization of the ferromagnetic n-type semiconductive layer 12, the spin polarization of a positive hole that is spin polarized in the ferromagnetic p-type semiconductive layer 11 and the spin polarization of an electron that is spin polarized in the ferromagnetic n-type semiconductive layer 12 also become parallel to one another. The positive hole and the electron which are polarized in parallel to one another are reconnected with an applied forward bias, and whereby a circularly polarized light can be generated. Incidentally, in the case of adopting the pin junction element 10 as the light emitting element, the insulative layer 13 is formed by a material to be used for an active layer.

Here, since both the positive hole and the electron which are reconnected are spin polarized, a light with a higher degree of polarization is generated as compared to the case wherein only the positive hole is spin polarized. As a result, it is possible to form the light emitting element which generates a circularly polarized light of a still higher degree of polarization. Here, in the case where only the positive hole is spin polarized, and the electron is not spin polarized, it is be expected that a light with a low degree of polarization (5%, for example) is generated, that is between the degree of spin polarization of the positive hole (10%, for example) and the degree of polarization of the electron (0%, for example); on the other hand, in the case where both the positive hole and the electron are spin polarized, a light with a relatively high degree of polarization can be generated corresponding to the degrees of polarization of the positive hole and the electron (respectively 10%, for example).

As described, the pin junction element 10 in accordance with the present invention can be used as a semiconductor light emitting element which emits light with an applied forward bias. The pin junction element 10 of the present invention includes the p-type semiconductive layer (ferromagnetic p-type semiconductive layer 11) and the n-type semiconductive layer (ferromagnetic n-type semiconductive layer 12) which are connected via an active layer (insulative layer 13), and these p-type semiconductive layer and n-type semiconductive layer are respectively made of ferromagnetic members. Furthermore, the pin junction element 10 is capable of controlling the light emitting characteristics (degree of polarization, in particular) with an applied bias and magnetic field.

For the p-type semiconductor, it is required to be functioned as a ferromagnetic member and as a p-type semiconductor at operating temperature of the pin junction element 10, and it is desirable to be functioned as a ferromagnetic member and as a p-type semiconductor at or above room temperature. Similarly, for the n-type semiconductor layer, it is required to be functioned as a ferromagnetic member and an n-type semiconductor at operating temperatures of the pin junction element 10, and it is desirable to be functioned as a ferromagnetic member and as an n-type semiconductor at or above room temperature.

In the present embodiment, explanations have been given through the case of the pin junction element 10 and the pn junction element 20; however, the present invention may be applicable to such element as an npn junction element, an pnp junction element, a transistor, etc., adopting the pin junction element 10 or the pn junction element 20.

FIRST EMBODIMENT

The following descriptions will explain the pin junction element 10 in accordance with one embodiment of the present invention in reference to FIGS. 1, 7 through 12.

Figure 1:
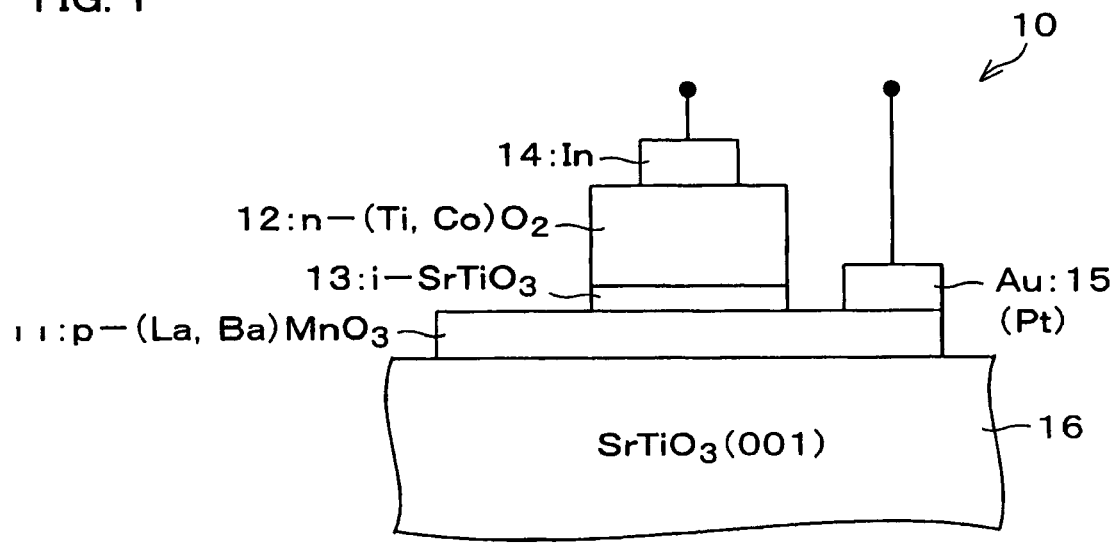
FIG. 1 is a cross-sectional view illustrating the structure of a p-(La, Ba) $MnO_3$/i-$SrTiO_3$/n-(Ti,Co)$O_2$ diode as an example of an pin junction element in accordance with the present invention.

FIG. 1 is a cross-sectional view illustrating the structure of the p-(La, Ba) $MnO_3$/i-$SrTiO_3$/n-(Ti, Co)$O_2$ diode prepared as a sample of the pin junction element 10. According to this pin junction element 10, on the (001) surface of the monocrystal i-$SrTiO_3$ substrate as the substrate 16, formed is a heterostructure of the (La,Ba)$MnO_3$ layer as the ferromagnetic p-type semiconductive layer 11, the $SrTiO_3$ layer as the insulative layer 13, the (Ti,Co) $O_2$ layer as the ferromagnetic n-type semiconductive layer 12 which are laminated in this order.

When adopting the ferromagnetic p-type semiconductive layer 11 made of (La, Ba) $MnO_3$, it is possible to maintain the p-type semiconductor characteristics and ferromagnetism relatively at high temperatures. Similarly, when adopting the ferromagnetic n-type semiconductive layer 12 made of (Ti, Co) $O_2$, it is possible to maintain the n-type semiconductor characteristics and the ferromagnetism relatively at high temperatures.

Here, the (La,Ba) $MnO_3$ layer is formed in the thickness of 300 Å, with a composition ratio of La to Ba, (1-x):x of 0.9:0.1, ($(La_{1-x}, B_{ax}) MnO_3$, x=0.1). The $SrTiO_3$ layer is formed in a thickness of 300 Å. The (Ti, Co)$O_2$ layer is formed in a thickness of 5000 Å, with a composition ratio of Ti to Co, (1-y):y of 0.93:0.07, (($Ti_{1-y}, Co_y)O_2$, y=0.07, in the general formula). The electron density of the (Ti, Co)$O_2$ layer under the typical conditions for forming films is set around $2.4 \times 10^{18}$ (/$cm^3$) in considerations of abnormal Hall effect.

On the (La,Ba) MnO$_3$ layer, and in a part of the region other than the region where the SrTiO$_3$ layer is formed an Au layer or a Pt layer is formed as the electrode 15, and on the (Ti, Co)O$_2$ layer, an In layer is formed as electrodes 14.

Figure 7:
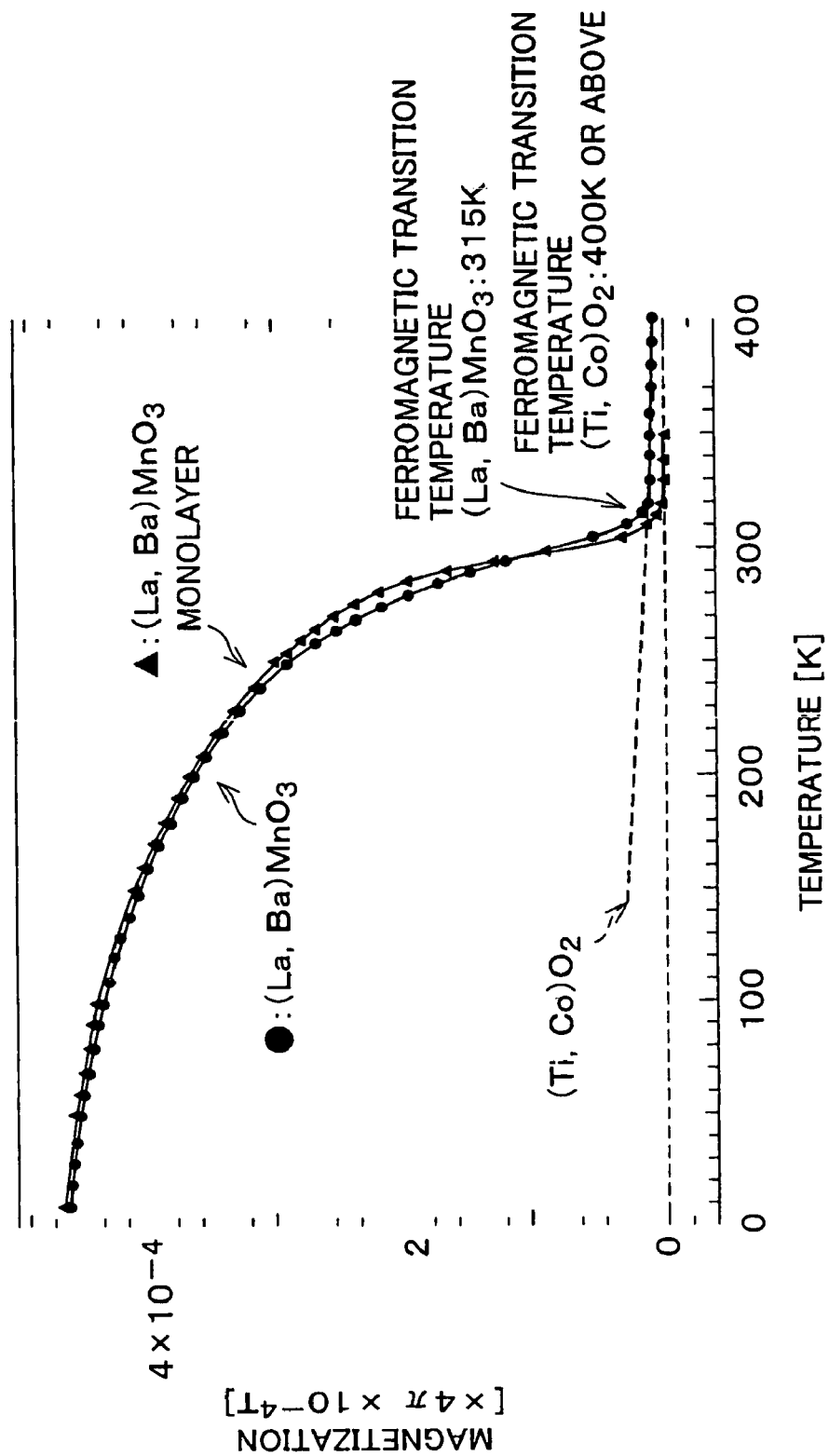
FIG. 7 is a graph illustrating the relationship between temperatures and magnetizations of (La, Ba) $MnO_3$ layer and (Ti, Co) $O_2$ layer.

FIG. 7 shows a graph illustrating the relationship between the temperature and the magnetization of the (La,Ba) MnO$_3$ layer and the (Ti, Co)O$_2$ layer of the pin junction element 10 of FIG. 1. FIG. 7 also shows the relationship between the temperature and the magnetization of the single (La,Ba) MnO$_3$ layer. As can be seen from FIG. 7, Curie temperatures (ferromagnetic transition temperatures) of the (La,Ba) MnO$_3$ layer and the (Ti, Co)O$_2$ layer in the pin junction element 10 are respectively 315K for the (La,Ba) MnO$_3$ layer and 400 K or above for the (Ti, Co)O$_2$ layer. In the pin junction element 10, it is confirmed that both ferromagnetic p-type semiconductive layer 11 and ferromagnetic n-type semiconductive layer 12 show ferromagnetism at room temperature.

Figure 8:
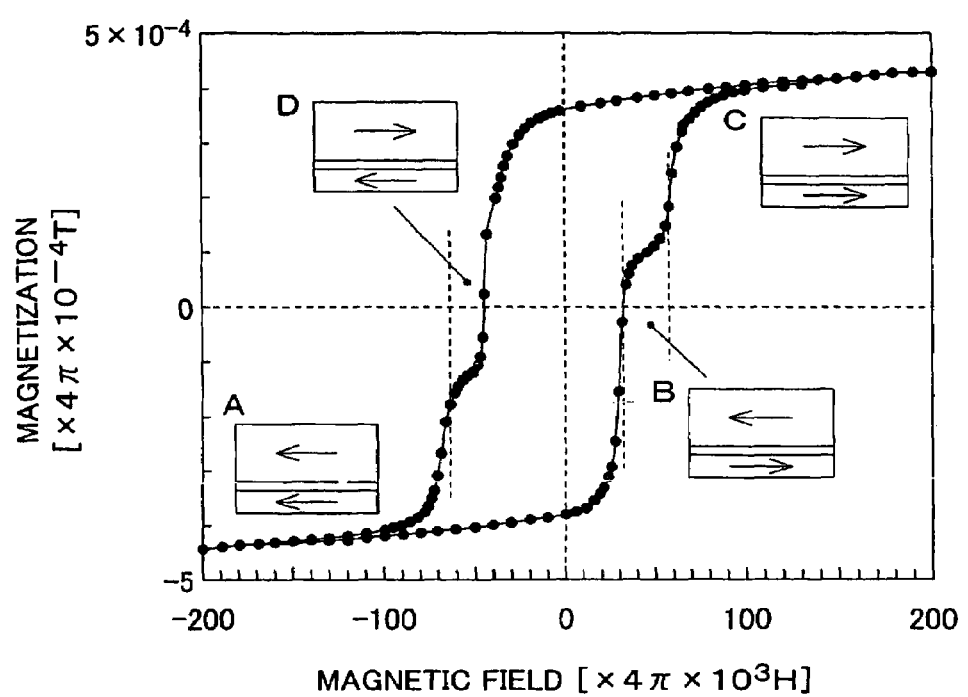
FIG. 8 is a graph illustrating a magnetic hysteresis curve of the pin junction element of FIG. 1 with an applied magnetic field in an in-plane direction of each layer.

FIG. 8 is a graph which shows the magnetic hysteresis curve (at temperature 10K) of the pin junction element 10 of FIG. 1 with an applied magnetic field in an in-plane direction of each layer. Namely, it is confirmed that the pin junction element 10 shows a stepped type hysteresis wherein as an applied magnetic field is varied step by step as $-200 \rightarrow 0 \rightarrow 200 \rightarrow 0 \rightarrow -200$ ($\times 4\pi \times 10^3$H), respective magnetization directions of the (La, Ba) MnO$_3$ layer and (Ti, Co)O$_2$ layer are also changed as both of the magnetizations are aligned in the negative direction (A), only the (La,Ba) MnO$_3$ layer is aligned in the positive direction (B), both of the magnetizations are aligned in the positive direction (C), and only the (La, Ba) MnO$_3$ layer is aligned in the negative direction (D), and again both of the magnetizations are aligned in the negative direction (A). The foregoing stepped type hysteresis is shown due to the difference in coercive force between the (La,Ba) MnO$_3$ layer and (Ti, Co)O$_2$ layer. As a result, a combination of mutually different spin directions ($\downarrow\downarrow$, $\uparrow\downarrow$, $\uparrow\uparrow$, $\downarrow\uparrow$) can be realized in each layer by the magnetic field.

With this mechanism, data can be written in the pin junction element 10 by the magnetic field, and the data as written can be stored as a combination of the magnetizations of the (La, Ba) MnO$_3$ layer and the (Ti, Co)O$_2$ layer in the pin junction element 10.

Figure 9:
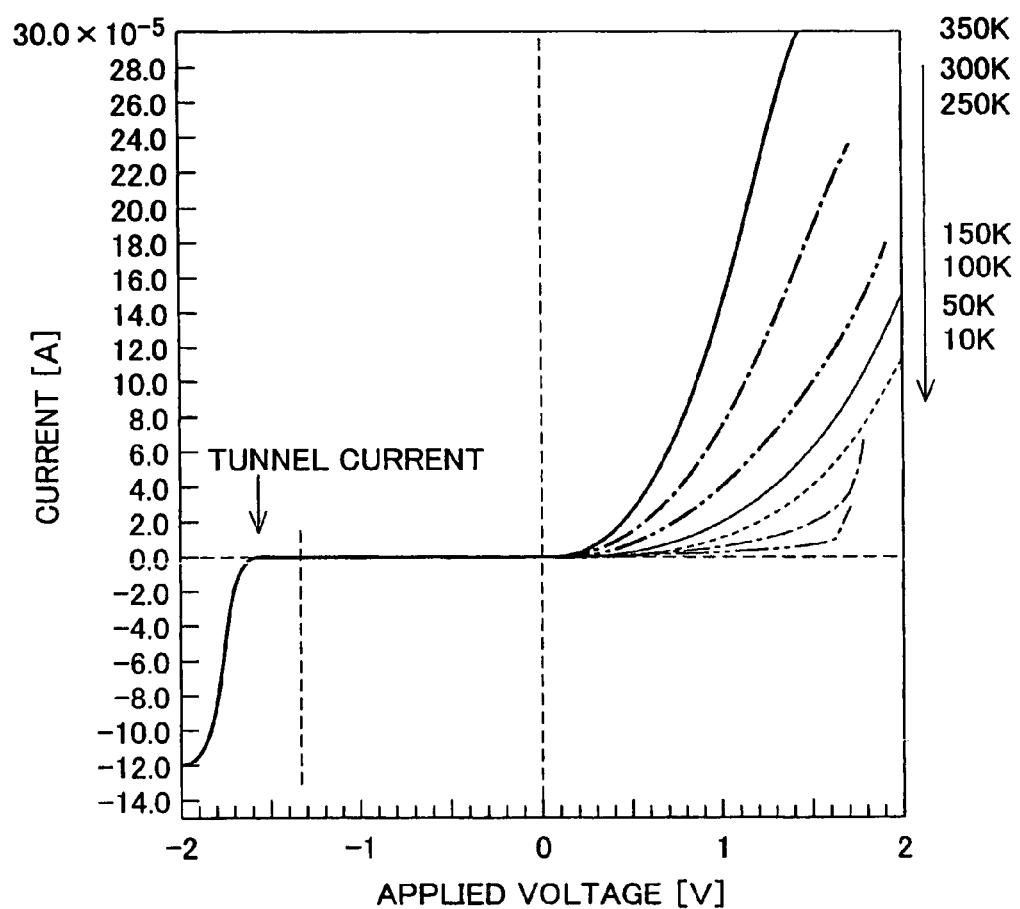
FIG. 9 is a graph (I-V curve) illustrating the relationship between an applied bias and the current when the bias is applied to electrodes of the pin junction element of FIG. 1.

FIG. 9 is a graph (I-V curve) illustrating the relationship between applied bias and flowing current with respect to variable temperatures when the bias is applied to electrodes 14 and 15 of the pin junction element 10 of FIG. 1. As shown in FIG. 9, the rectifying action is confirmed in the pin junction element 10. Incidentally, the diffusion potential difference at 300 K is 0.3 V. The tunnel current is observed at around −1.3V (backward bias 1.3V) or lower.

Here, with an applied predetermined backward bias to the pin junction element 10, different tunnel currents according to the magnetization directions of the (La,Ba) MnO$_3$ layer and the (Ti, Co) O$_2$ layer can be observed (TMR effect), thereby reading out data written in the pin junction element 10 according to the tunnel current value.

Next, the method of manufacturing the pin junction element 10 of FIG. 1 will be explained. The (La,Ba) MnO$_3$ layer, the SrTiO$_3$ layer and the (Ti, Co)O$_2$ layer are formed by the laser application method. The conditions for forming each layer are considered.

Figure 10:
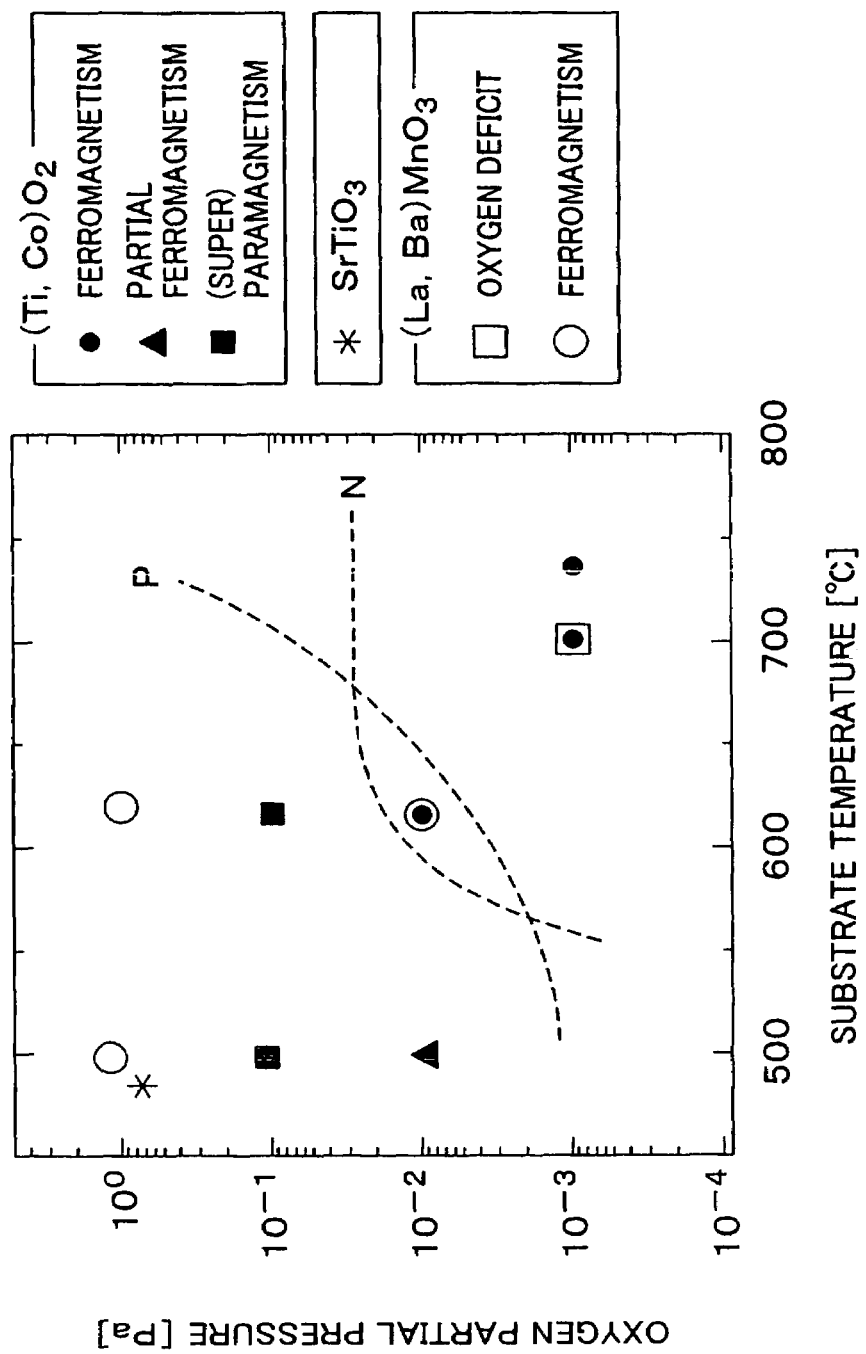
FIG. 10 is a diagram (phase diagram) showing the results of testing conditions under which a (La, Ba) $MnO_3$ layer and a (Ti,Co) $O_2$ layer show ferromagnetism at room temperature.

FIG. 10 is a digraph (phase diagram) showing results of conditions under which the (La,Ba) MnO$_3$ layer and the (Ti, Co)O$_2$ layer show ferromagnetism at room temperatures.

For this (La,Ba) MnO$_3$ layer, the lower is the temperature and the higher is the oxygen pressure, it is more likely that the (La,Ba) MnO$_3$ layer shows ferromagnetism; on the other hand, the higher is the temperature and the lower is the oxygen pressure, it is less likely to be ferromagnetic for the following reasons. That is, as the (La,Ba) MnO$_3$ layer is the p-type semiconductor, the carrier (positive hole) density becomes higher by increasing the amount of oxygen, and the Curie temperature becomes higher as the carrier concentration increases.

For the (Ti, Co) O$_2$ layer, the higher is the temperature and the lower is the oxygen pressure, ferromagnetism is more likely to be shown; on the other hand, the lower is the temperature and the higher is the oxygen pressure, ferromagnetism is less likely to be shown for the following reasons. That is, as the (Ti, Co)O$_2$ layer is the n-type semiconductor, the carrier (electrons) density becomes higher by decreasing the amount of oxygen, and the Curie temperature becomes higher as the carrier concentration increases.

Therefore, for the (La,Ba) MnO$_3$ layer to be formed first, conditions can be set to the conditions desirable for the (La, Ba) MnO$_3$ layer itself. As to the (Ti, Co)O$_2$ layer to be formed after forming the (La,Ba) MnO$_3$ layer, it is desirable to set the conditions not only to be suited for the formation of the (Ti, Co) O$_2$ layer (to the right and below the intermediate dotted line N in FIG. 10) but also not to disturb the characteristics of the (La,Ba) MnO$_3$ layer (to the left and above the dotted line P in FIG. 10). Namely, it is preferable that the (Ti, Co) O$_2$ layer be formed in a range surrounded by the intermediate dotted line P and the dotted line N in FIG. 10, and at temperatures in a range of 833 K to 1053 K.

Namely, when the (Ti, Co) O$_2$ layer is to be formed, the (La,Ba) MnO$_3$ layer is formed already, and characteristics of the (La,Ba) MnO$_3$ layer may be changed according to the (Ti, Co) O$_2$ layer forming conditions. Therefore, when forming the (Ti, Co) O$_2$ layer under the conditions desirable only for the formation of the (Ti, Co)O$_2$ layer, i.e., at high temperature and low oxygen pressure, with a reduction in carrier concentration of the (La,Ba) MnO$_3$ layer, the (La,Ba) MnO$_3$ layer may not show the ferromagnetism at room temperature.

Here, it is also necessary to take the conditions of forming the SrTiO$_3$ layer into considerations. In order to form a desirable SrTiO$_3$ layer, the conditions of the low temperature and high oxygen pressure are desirable as indicated as "*" in FIG. 10. Therefore, the order of forming the layers is important, i.e., after forming the (La,Ba) MnO$_3$ layer, the SrTiO$_3$ layer is formed, and then the (Ti, Co) O$_2$ layer is formed.

Namely, for the (La,Ba) MnO$_3$ layer to be formed first, it is difficult to reduce the carrier concentration of the (La,Ba) MnO$_3$ layer even when forming the SrTiO$_3$ layer under the conditions of lower temperature and high oxygen. It is therefore possible to maintain the Curie temperature of the (La,Ba) MnO$_3$ layer. The (Ti, Co)O$_2$ layer is then formed by setting the conditions to be the range surrounded by the dotted line P and the dotted line N. In this example, after forming the (La,Ba) MnO$_3$ layer and the SrTiO$_3$ layer, the (Ti, Co)O$_2$ layer is formed under the conditions of the substrate temperature of 893 K and oxygen pressure of $10^{-2}$ Pa. Incidentally, the (La, Ba) MnO$_3$ layer is formed under the conditions of the substrate temperature of 1023 K, the oxygen pressure of $10^{-1}$ Pa, and is then annealed under the oxygen pressure of $10^5$ Pa.

In contrast, when the layers are formed in the reversed order, i.e., after forming the (Ti, Co)O$_2$ layer, the SrTiO$_3$ layer is formed at low temperature and high oxygen conditions, the carrier concentration of the (Ti, Co)O$_2$ layer is lowered, which in turn lowers the Curie temperature of the carrier concentration.

As described, the method of manufacturing the pin junction element 10 of FIG. 1 includes the steps of forming the (La,Ba) MnO$_3$ layer as the ferromagnetic p-type semiconductive layer 11 on the substrate 16, forming the insulative layer 13 on this ferromagnetic p-type semiconductive layer 11, and forming the (Ti, Co)O$_2$ layer as the ferromagnetic n-type semiconductive layer 12 on the insulative layer 13. At the operating temperature of this pin junction element 10, the condition of the substrate temperature and oxygen pressure under which (La,Ba) MnO$_3$ maintains its characteristics as ferromagnetic p-type semiconductor is defined as the first condition, and the condition of the substrate temperature and the oxygen pressure when manufacturing the (Ti, Co) O$_2$ layer, under which (Ti, Co) O$_2$ layer serves as the ferromagnetic n-type semiconductor is defined to be the second condition, it is desirable that the (Ti, Co)O$_2$ layer is manufactured under the first and second conditions.

Next, each layer will be explained in more details.

SrTiO$_3$ is obtainable at low price, and further its electric characteristics can be controlled with ease to be functioned as the n-type semiconductor by doping La or Nb. For these beneficial features, SrTiO$_3$ is used for the material of the substrate 16 and the insulative layer 13.

Figure 11:
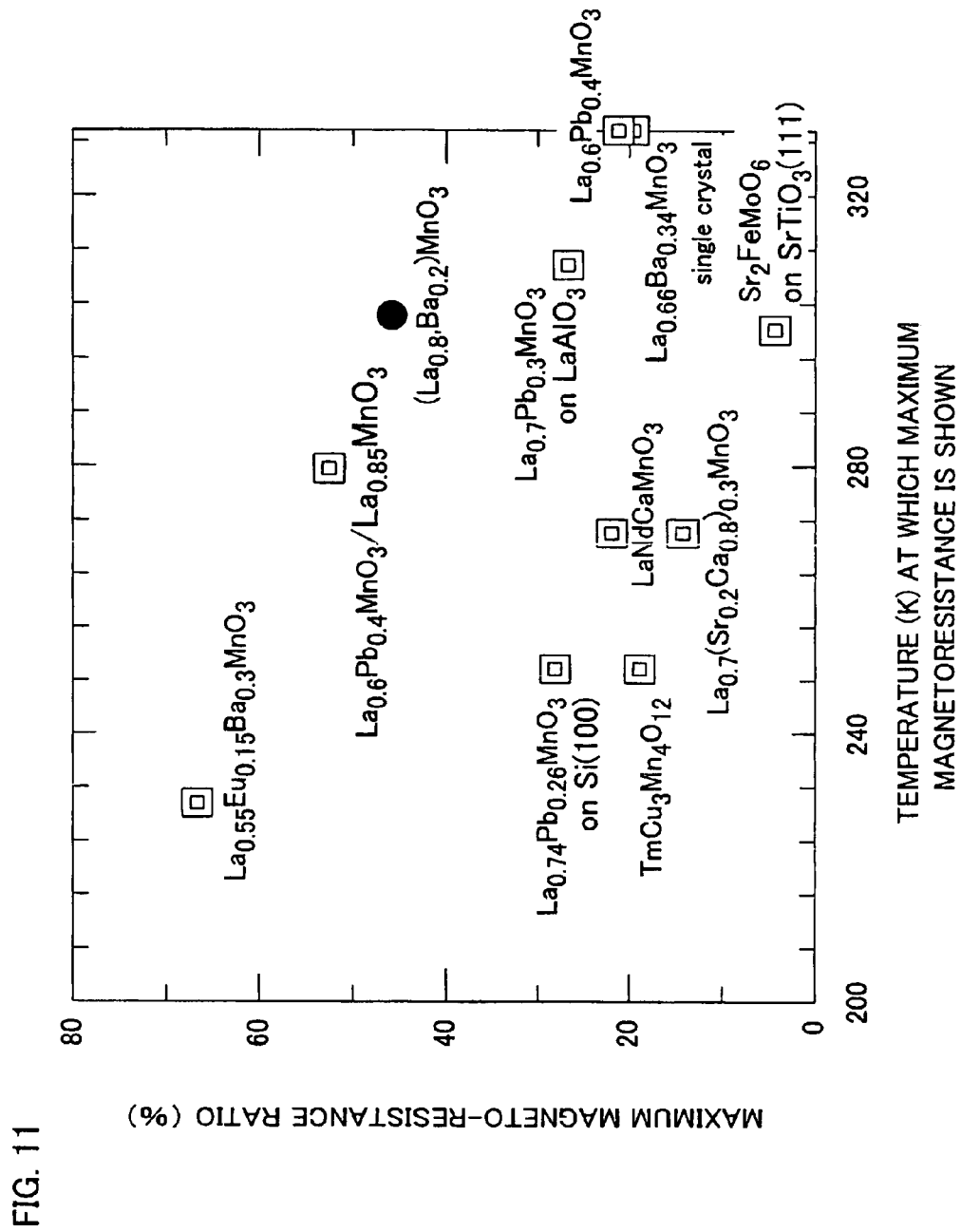
FIG. 11 is a graph illustrating the results of comparison between a conventional ferromagnetic material and (La, Ba) $MnO_3$ adopted in the present invention, with regard to a temperature at which a magneto-resistance ratio (maximum MR ratio) is maximized and the corresponding MR ratio (8000 ($\times 4\pi \times 10^3$H) with an applied magnetic field).

FIG. 11 is a diagram showing the result of comparison between a known ferromagnetic material and the (La,Ba) MnO$_3$ adopted in this example, with regard to the maximum magnetic resistance ratio (maximum MR ratio) and the corresponding maximum MR ratio (with an applied magnetic field 8000 ($\times 4\pi \times 10^3$H). The (La,Ba) MnO$_3$ in FIG. 11 is formed in a thickness of 1000 Å on the (001) surface of the monocrystal SrTiO$_3$ substrate under the condition of (La$_{1-x}$, B$_{ax}$) MnO$_3$, x=0.2. Incidentally, when the condition set to (La$_{1-x}$, B$_{ax}$) MnO$_3$, x=0.1, almost the same effects can be achieved.

As can be seen from FIG. 11, in the (La,Ba) MnO$_3$, the maximum MR ratio is shown at or above room temperature, which is higher than the maximum MR ratio of other materials. Here, such combination of monocrystal SrTiO$_3$ substrate as the substrate 16, and (La,Ba) MnO$_3$ as the ferromagnetic p-type semiconductive layer 11 is desirable.

Figure 12:
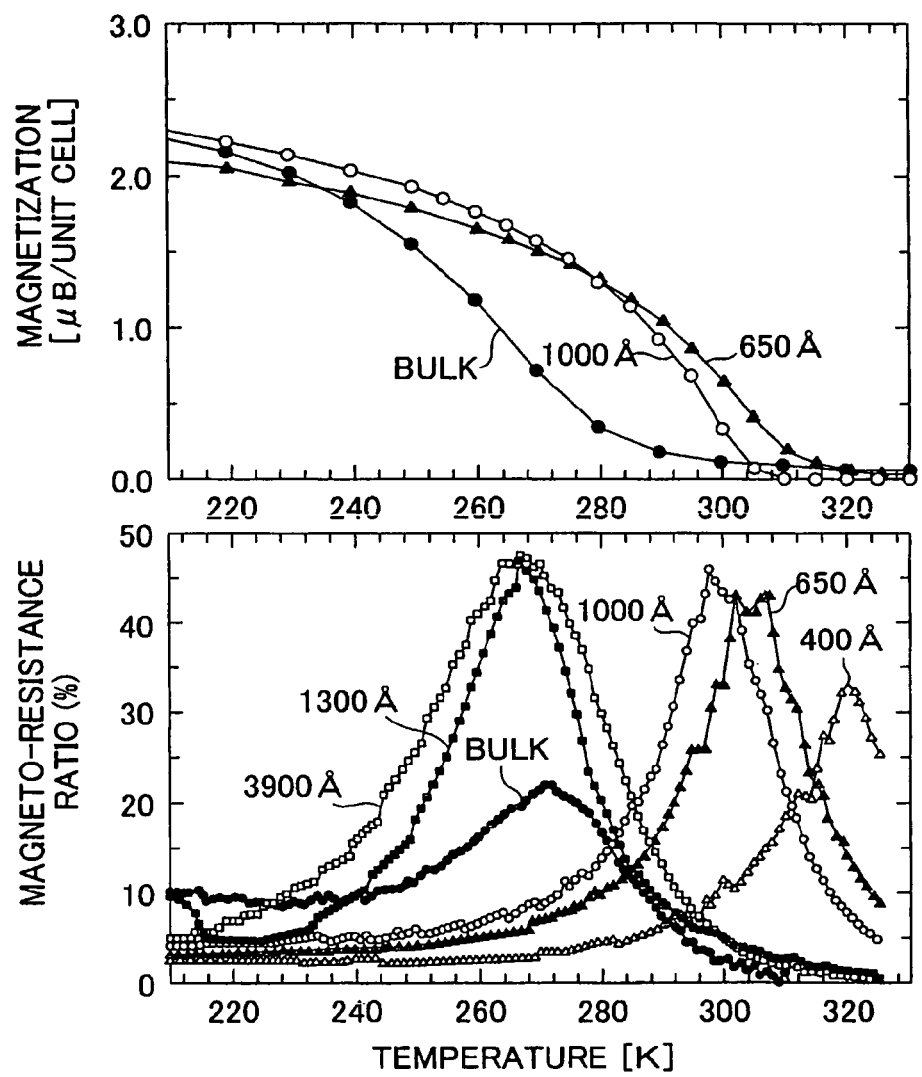
FIG. 12 is a graph which shows the relationship between the temperature, magnetization and magneto-resistance ratio (MR ratio) of (La,Ba) $MnO_3$ formed on a (001) surface of the monocrystal $SrTiO_3$ substrate with respect to variable film thickness of the (La,Ba) $MnO_3$.

FIG. 12 is graph showing the relationship among the temperature, magnetization and the magnetic resistance ratio (MR ratio) of the (La, Ba) SrTiO$_3$ formed on the (001) surface of the monocrystal SrTiO$_3$ substrate as measured for each film thickness of (La,Ba) MnO$_3$. Incidentally, the condition is set to (La$_{1-x}$, B$_{ax}$) MnO$_3$, x=0.2; however, almost the same effects can be achieved under the condition of (La,Ba) MnO$_3$ (La$_{1-x}$, B$_{ax}$) MnO$_3$, x=0.1.

At temperatures below the temperature at which the magnetic resistance ratio is maximized, the (La, Ba) MnO$_3$ is ferromagnetic. Therefore, as can be seen from FIG. 12, the (La,Ba) MnO$_3$ is ferromagnetic at room temperature when formed in a thickness of 1000 Å or thinner. Therefore, in the case where the pin junction element 10 is used at room temperature, it is desirable that the (La,Ba) MnO$_3$ be formed in a thickness of 1000 Å or thinner. Incidentally, there is such tendency that as the (La,Ba) MnO$_3$ film is formed thinner than 50 Å, the Curie temperature is reduced on the contrary. It is therefore preferable that the (La,Ba) MnO$_3$ film be formed in a thickness of 50 Å or thicker.

In general, the Curie temperature of the oxide manganese oxide ferromagnetic material formed on the monocrystal SrTiO$_3$ substrate tends to be lower than its Curie temperature in the bulk state (in the case of (La,Ba) MnO$_3$, for example. However, when the (La,Ba) MnO$_3$ is formed on the (001) surface of the monocrystal SrTiO$_3$ substrate, in a thickness of 1000 Å or thinner, its Curie temperature tends to be higher than its Curie temperature in the bulk state. Therefore, it can be said also for the above reason that a combination of the monocrystal SrTiO$_3$ substrate as the substrate 16 and (La,Ba) MnO$_3$ as the ferromagnetic p-type semiconductive layer 11 is desirable.

In order to form the (La, Ba) MnO$_3$ layer uniform and relatively thin, i.e., in a thickness of 1000 Å or below in desirable quality, it is preferable to form the layer, for example, at the rate of 100 Å/20 min.

For the composition ration of La and Ba of the (La, Ba) MnO$_3$ layer, it is desirable that the condition of (La$_{1-x}$, B$_{ax}$) MnO$_3$, 0.1≦x be satisfied. Under the condition of x<0.1, it is difficult to maintain the (La, Ba) MnO$_3$ layer to be ferromagnetic at room temperatures. It is desirable to satisfy the condition of x≦0.2. For the thin film of (La, Ba) MnO$_3$ layer, when the condition is set to 0.2<x, the Curie temperature may be lowered.

Incidentally, irrespectively of room temperatures, when operating at temperatures below the room temperature, it is not necessarily to set the condition within the above-defined ranges.

The SrTiO$_3$ layer as the insulative layer 13 with a combination of the (La,Ba) MnO$_3$ layer formed therebelow permits the (La,Ba) MnO$_3$ layer to maintain to be ferromagnetic at relatively high temperatures. Namely, it is conceivable that the relationship between the SrTiO$_3$ layer and the (La,Ba) MnO$_3$ layer is also similar to that of FIG. 12. Therefore, when adopting (La,Ba) MnO$_3$ layer as the ferromagnetic p-type semiconductive layer 11, it is desirable to adopt the SrTiO$_3$ layer for the insulative layer 13.

In FIG. 12, the thinner is the (La,Ba) MnO$_3$ layer, the higher is the Curie temperature. The thinner is the (La,Ba) MnO$_3$ layer, the more obvious is the effects on an interface between the (La,Ba) MnO$_3$ layer and the SrTiO$_3$ layer. For this feature, it is conceivable that the Curie temperature is high on the interface of the (La,Ba) MnO$_3$ layer. In particular, the interface between the ferromagnetic p-type semiconductive layer 11 and the insulative layer 13 is liable to be affected by the TMR effect, and it is therefore preferable that the Curie temperature be high on the interface. Also for this reason, when adopting (La,Ba) MnO$_3$ layer as the ferromagnetic p-type semiconductive layer 11, it is desirable to adopt the SrTiO$_3$ layer as the insulative layer 13.

It is preferable that the SrTiO$_3$ layer be formed thin and uniform so as to allow charges to pass therethrough by the tunnel phenomenon. To obtain the tunnel phenomenon with ease, the SrTiO$_3$ layer is formed desirably in a thickness of 500 Å or thinner, more desirably in a thickness of 300 Å or thinner, still more desirably in a thickness of 100 Å or thinner. As described, it is preferable that the SrTiO$_3$ layer be formed relatively thin; however, it is not necessary to form as thin as a few atoms thick as required in the conventional TMR element 50.

In the unit cell of SrTiO$_3$ has a thickness of 4 Å, and the SrTiO$_3$ layer has at least one unit cell. Namely, it is necessary to form SrTiO$_3$ layer in a thickness of 4 Å or thicker. Additionally, in order to form the SrTiO$_3$ layer to be functioned more desirably as the insulative layer 13, it is more desirable that the SrTiO$_3$ layer be formed in a thickness of 8 Å (2 unit cells) or thicker.

In order to form the SrTiO$_3$ layer uniform and relatively thin, i.e., in a thickness of 500 Å or thinner in desirable quality, it is preferable to form the layer, for example, at the rate of 100 Å/60 min.

For the (Ti, Co)O$_2$ layer as the ferromagnetic n-type semiconductive layer 12, it is only required to have a desirable interface condition with the SrTiO$_3$ layer, and it is not necessarily to form the (Ti, Co)O$_2$ layer thin. It is therefore possible to form the (Ti, Co)$O_2$ layer at relatively high speed, for example, at the rate of 5,000 Å/2 h.

For the composition ratio of Ti and Co of the (Ti,Co) $O_2$ layer, it is desirable that the condition of $(Ti_{1-y}, Co_y)$ $O_2$, $0<0.005 \leq y$ be satisfied. Under the condition of $y<0.005$, it is difficult to maintain the (Ti,Co) $O_2$ layer to be ferromagnetic. It is desirable to satisfy the condition of $y \leq 0.08$ because under the condition of $0.08<y$, due to the deposition of Co, it is difficult to form the (Ti,Co) $O_2$ layer.

SECOND EMBODIMENT

Figure 13:
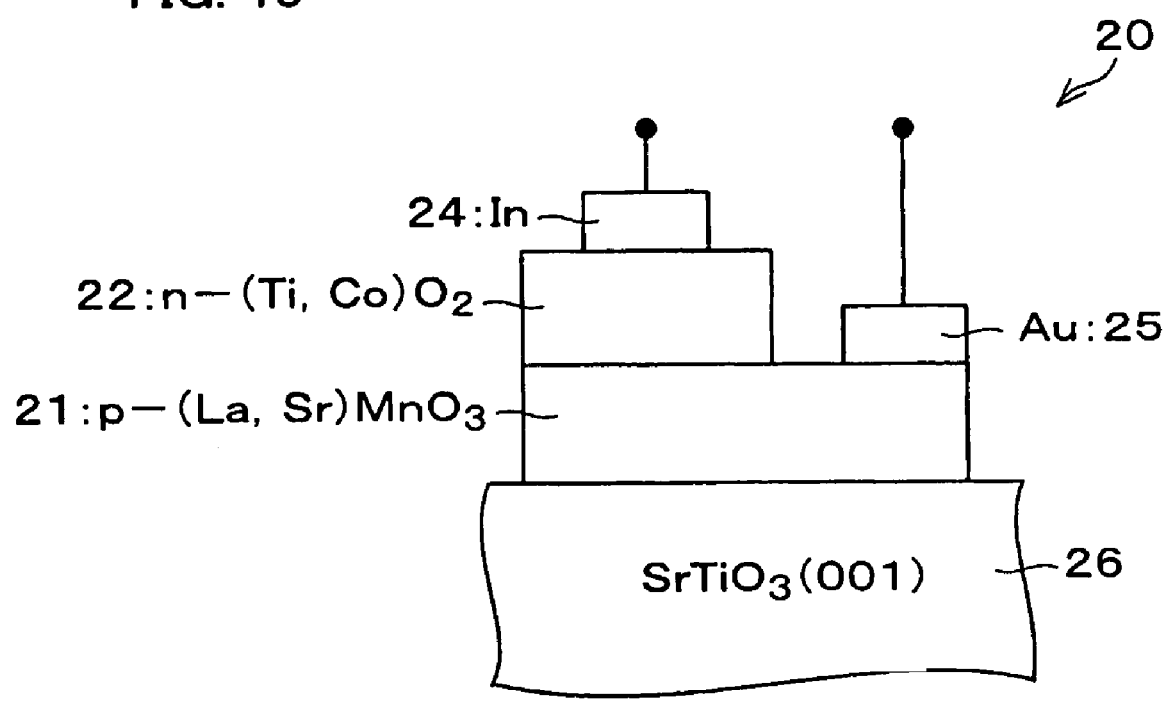
FIG. 13 is a cross-sectional view illustrating the structure of a p-(La, Sr) $MnO_3$/n-(Ti, Co) $O_2$ diode as an example of a pn junction element in accordance with the present invention.
Figure 14:
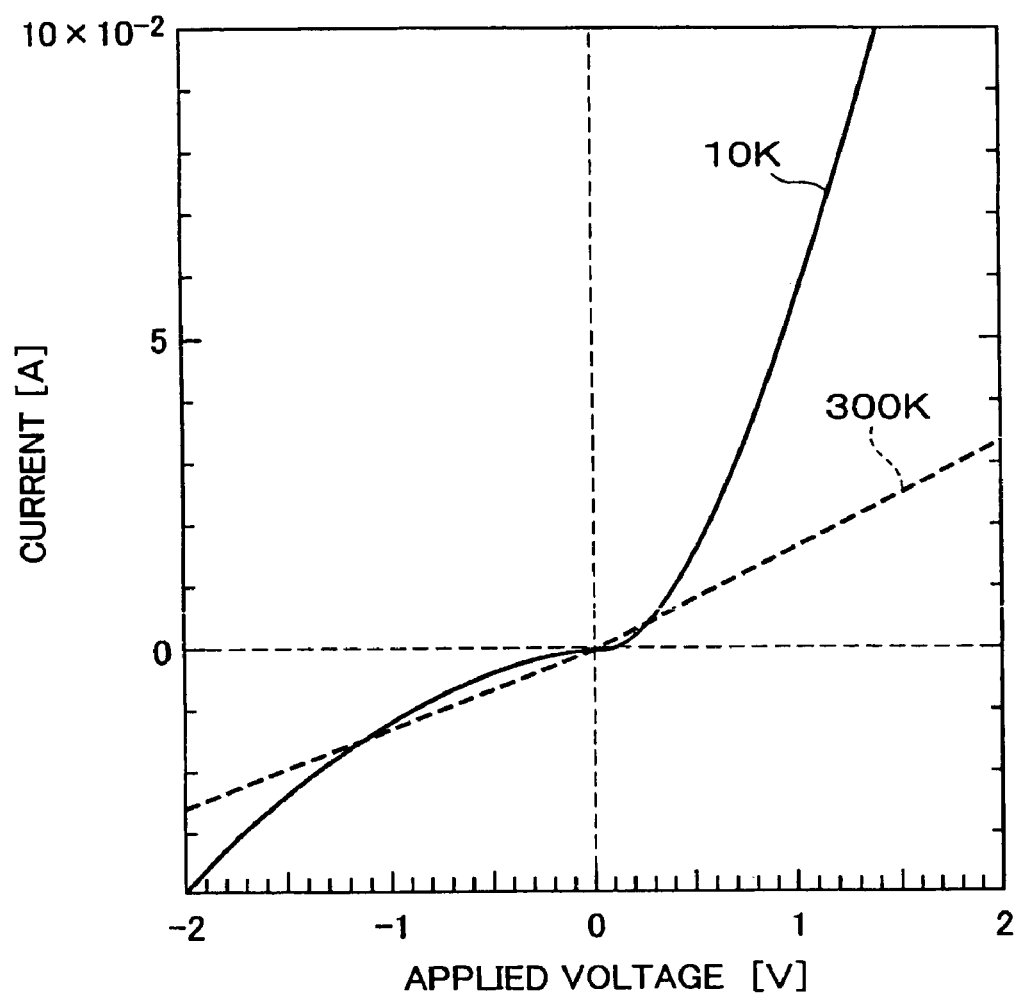
FIG. 14 is a graph (I-V curve) showing the relationship between an applied bias and a flowing current when a bias is applied to electrodes of the pn junction element of FIG. 13 with respect to variable temperature.

The following descriptions will explain the pn junction element 20 in accordance with one embodiment of the present invention in reference to FIGS. 13 and 14.

FIG. 13 is a cross-sectional view illustrating the structure of an p-(La,Sr) $MnO_3$/n-(Ti,Co) $O_2$ diode prepared as a sample of the pn junction element 20. According to this pn junction element 20, on the surface (001) of the monocrystal $SrTiO_3$ substrate as the substrate 26, formed is a heterostructure of the (La,Sr) $MnO_3$ layer as the ferromagnetic p-type semiconductive layer 21, the (Ti, Co)$O_2$ layer as the ferromagnetic n-type semiconductive layer 22 which are laminated in this order.

Here, the (La,Sr) $MnO_3$ layer is formed with a composition ratio of La to Sr, ((1-v):v) of 0.7:0.3, $(La_{1-v}, Sr_v)$ $MnO_3$, v=0.3). The $SrTiO_3$ layer is formed in a thickness of 300 Å. The (Ti, Co) $O_2$ layer is formed with a composition ratio of Ti to Co, (1-w):w) of 0.93:0.07, $((Ti_{1-w}, Co_w)O_2$, y=0.07, in the general formula).

On the (La,Ba) $MnO_3$ layer, and in a part of the region other than the region where the (Ti, Co)$O_2$ layer is formed, an Au layer is formed as the electrodes 25, and on the (Ti, Co)$O_2$ layer, an In layer is formed as electrodes 24.

FIG. 14 is a graph (I-V curve) illustrating the relationship between an applied bias and the current when the bias is applied to electrodes 24 and 25 of the pn junction element 20 of FIG. 13 for respective temperatures. In this pn junction element 20, although a clear rectifying action is observed, the asymmetry of the current flow can be confirmed at temperature 10K depending on the direction of the applied current (forward, backward). It is therefore conceivable that with an applied backward bias, the tunnel current flows, thereby obtaining the TMR effect.

In this case, however, it may be difficult to detect changes in current by the TMR effect. In response, by reducing the carrier concentrations of the (La, Sr) $MnO_3$ layer and the (Ti, Co)$O_2$ layer, it is preferable to realize the reading of the data by the TMR effect, by making the pn junction element 20 have the rectifying action to detect changes in tunnel current with ease. In order to realize the foregoing structure, it is preferable that the respective carrier concentrations of the (La,Ba) $MnO_3$ layer and the (Ti, Co)$O_2$ layer be set $10^{17}$(/$cm^3$) or higher and $10^{19}$ (/$cm^3$) or below, and more preferably $10^{17}$(/$cm^3$) or higher and $10^{18}$ (/$cm^3$).

Incidentally, it is conceivable that by replacing the (La,Sr) $MnO_3$ layer with the (La,Ba) $MnO_3$ layer to make the pn junction element 20 to have the rectifying action, changes in tunnel current can be detected with ease.

For the ferromagnetic p-type semiconductive layers 11 and 21 in accordance with the first embodiment and the second embodiment, perovskite-type magnetic member such as (La, Ba) $MnO_3$, (La, Sr) $MnO_3$, (La, Ca) $MnO_3$, (La,Sr) $MnO_3$ layer, etc., (Ga, Mn)As, (Ga, Mn)N, etc., may be used. For the ferromagnetic n-type semiconductive layers 12 and 22 in accordance with the first embodiment and the second embodiment, (Ti, Co) O2, (Zn, V)O, (Zn,Co)O, (La,Ce) $MnO_3$ layer, etc., may be adopted.

The ferromagnetic p-type semiconductive layer 11, the ferromagnetic n-type semiconductive layer 12, the insulative layer 13, the ferromagnetic p-type semiconductive layer 21, and the ferromagnetic n-type semiconductive layer 22 in accordance with the first embodiment or the second embodiment may be formed, for example, by the laser ablation method; however, other method such as the MBE (Molecular Beam Epitaxy) method, the laser MBE method, the sputtering method, the CVD method, may be adopted.

As described, the tunneling magnetoresistive element in accordance with the present invention which includes the first ferromagnetic layer and the second ferromagnetic layer which are connected via an insulative layer, and which shows a tunneling magnetoresistance according to the magnetization of the first ferromagnetic layer and the magnetization of the second ferromagnetic layer is arranged such that the first ferromagnetic layer is a p-type semiconductor, and the second ferromagnetic layer is an n-type semiconductor.

According to the foregoing arrangement, the pin junction is formed, and with an applied backward bias to the pin junction, an empty layer is formed, and a tunnel current is generated via the empty layer. Therefore, according to the foregoing structure, the control precision required for the process of forming the insulative layer is not as high as that required for the insulative layer of the conventional tunneling magnetoresistive element. Namely, as compared to the conventional tunneling magnetoresistive element, the tunneling magnetoresistive element can be manufactured in a simpler manner.

The magnetic memory in accordance with the present invention includes the tunneling magnetoresistive element, wherein information is recorded according to the magnetization of the first ferromagnetic layer and the magnetization of the second ferromagnetic layer.

As described, by adopting the tunneling magnetoresistive element that can be manufactured with ease for the magnetic memory, it is also possible to manufacture the magnetic memory with ease.

The semiconductor junction element in accordance with the present invention in which a p-type semiconductive layer and an n-type semiconductive layer are connected via an insulative layer, and which generates a tunnel current with an applied backward bias, is arranged such that:

Both the p-type semiconductive layer and the n-type semiconductive layer are ferromagnetic members.

According to the foregoing arrangement, a pin junction is formed, and by applying backward bias to the pin junction, an empty layer is formed, and a tunnel current is generated via the empty layer. Here, both the p-type semiconductive layer and the n-type semiconductive layer are ferromagnetic members, and the tunnel magnetoresistance can be controlled with an externally applied magnetic field. It is therefore possible to utilize the semiconductor junction element as the tunneling magnetoresistive element. By utilizing this semiconductor junction element as the tunneling magnetoresistive element, it is possible to manufacture the tunneling magnetoresistive element in a simpler manner as compared to the case of the conventional tunneling magnetoresistive element.

The semiconductor junction element in accordance with the present invention is arranged such that the p-type semiconductive layer is made of (La,Ba) $MnO_3$. With this structure, it is possible to make the p-type semiconductive layer function both as the p-type semiconductor and the layer of the ferromagnetic member.

The semiconductor junction element in accordance with the present invention having the foregoing structure of the semiconductor junction element is arranged such that the insulative layer is made of $SrTiO_3$. In the case of adopting the p-type semiconductive layer made of (La,Ba) $MnO_3$, by adopting the insulative layer made up of $SrTiO_3$, it is possible to make the p-type semiconductive layer function as the layer of the ferromagnetic member at high temperatures.

The semiconductor junction element in accordance with the present invention having any of the foregoing structures is arranged such that the insulative layer includes unit cells of the $SrTiO_3$ in its thickness direction, and is formed in a thickness of 500 Å or thinner. According to the foregoing arrangement, the tunnel current can be generated with ease.

The semiconductor junction element in accordance with the present invention having any of the foregoing structures is arranged such that the n-type semiconductive layer is made of (Ti, Co)$O_2$. With this structure, it is possible to make the n-type semiconductive layer function both as the n-type semiconductor and the layer in the ferromagnetic member at relatively high temperatures.

The semiconductor junction element in accordance with the present invention in which a p-type semiconductive layer and an n-type semiconductive layer are connected, and which generates a tunnel current with an applied backward bias, is arranged such that:

Both the p-type semiconductive layer and the n-type semiconductive layer are ferromagnetic members respectively.

According to the foregoing arrangement, the pn junction is formed, and with an applied backward bias to the pn junction, an empty layer is formed, and a tunnel current is generated via the empty layer. Here, since both the p-type semiconductive layer and the n-type semiconductive layer are ferromagnetic members, the tunnel magnetoresistance can be controlled with an externally applied magnetic field. It is therefore possible to utilize the semiconductor junction element as the tunneling magnetoresistive element. By utilizing this semiconductor junction element as the tunneling magnetoresistive element, it is possible to manufacture the tunneling magnetoresistive element in a simpler manner as compared to the case of the conventional tunneling magnetoresistive element.

The magnetic memory in accordance with the present invention includes any one of the foregoing tunneling magnetoresistive elements, wherein information is recorded according to the magnetization of said first ferromagnetic layer and the magnetization of said second ferromagnetic layer. As described, by adopting the semiconductor junction element that can be manufactured in a simple manner as the tunneling magnetoresistive element, it is also possible to manufacture the magnetic memory with ease.

The semiconductor junction element in accordance with the present invention includes a (La,Ba) $MnO_3$ layer, a $SrTiO_3$ layer, and (Ti, Co)$O_2$ layer which are laminated in this order to form a heterojunction.

According to the foregoing arrangement, (La,Ba) $MnO_3$ layer can be functioned as the ferromagnetic p-type semiconductor, the $SrTiO_3$ layer can be functioned as the insulator, and the (Ti, Co)$O_2$ layer can be functioned as the ferromagnetic n-type semiconductor. As a result, it is possible to adopt as a tunneling magnetoresistive element, the semiconductor junction element that can be manufactured in a simpler manner as compared to a conventional magnetoresistive element.

The semiconductor junction element in accordance with the present invention having the foregoing structure is characterized in that the $SrTiO_3$ layer includes at least one unit cell of $SrTiO_3$ in its thickness direction, the $SrTiO_3$ layer being formed in a thickness of 500 Å or thinner. According to the foregoing arrangement, tunnel current is liable to be generated.

The semiconductor junction element in accordance with the present invention includes the (La,Ba) $MnO_3$ layer and the (Ti, Co)$O_2$ layer which are laminated to form a heterojunction.

According to the foregoing arrangement, the (La,Ba) $MnO_3$ layer can be functioned as the ferromagnetic p-type semiconductor, and the (Ti,Co)$O_2$ layer can be functioned as the ferromagnetic n-type semiconductor. As a result, it is possible to adopt as a tunneling magnetoresistive element, the semiconductor junction element that can be manufactured in a simpler manner as compared to a conventional magnetoresistive element.

The semiconductor junction element in accordance with the present invention having the foregoing structure is arranged so as to include the (La,Ba) $MnO_3$ layer and the (Ti, Co)$O_2$ layer which are laminated to form a heterojunction.

According to the foregoing arrangement, (La,Ba) $MnO_3$ layer can be functioned as a ferromagnetic p-type semiconductor, and the (Ti, Co) $O_2$ layer can be functioned as the ferromagnetic n-type semiconductor. As a result, it is possible to adopt as a tunneling magnetoresistive element, the semiconductor junction element that can be manufactured in a simpler manner as compared to a conventional magnetoresistive element.

The semiconductor light emitting element in accordance with the present invention includes the p-type semiconductive layer and the n-type semiconductive layer which are connected via an active layer, and which emits a light with an applied forward bias, wherein both the p-type semiconductive layer and the n-type semiconductive layer are ferromagnetic members.

According to the foregoing arrangement, by setting the magnetization of the p-type semiconductive layer parallel to the magnetization of the n-type semiconductive layer, the positive hole and the electrons which are spin polarized in mutually parallel directions are reconnected with an applied forward bias, thereby generating a circularly polarized light. In this case, since both the positive hole and the electrons are spin-polarized, a light with a high degree of polarization can be emitted. As a result, it is possible to realize a light emitting element which emits a circularly polarized light with a high degree of polarization.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

The invention claimd is:

1. A method of manufacturing a tunneling magnetoresistive element in which a first ferromagnetic layer which serves as p-type semiconductor and a second ferromagnetic layer which serves as an n-type semiconductor are connected via an insulative layer, and which shows tunneling magnetoresistance according to a magnetization of said first ferromagnetic layer and a magnetization of said second ferromagnetic layer, comprising:

forming said first ferromagnetic layer on a substrate;
forming the insulative layer on said first ferromagnetic layer; and
forming said second ferromagnetic layer on said insulating layer.

2. The method of manufacturing a tunneling magnetoresistive element as set forth in claim 1, wherein:

said step of forming said first ferromagnetic layer is carried out under such condition that said substrate is in a temperature range of from 833 K to 1053 K.

3. A method of manufacturing a semiconductor junction element in which a ferromagnetic p-type semiconductive layer and a ferromagnetic n-type semiconductive layer are connected via an insulative layer, and which generates a tunnel current with an applied backward bias, comprising:
　forming said ferromagnetic p-type semiconductor layer on a substrate;
　forming the insulative layer on said p-type semiconductor layer; and
　forming said ferromagnetic n-type semiconductor layer on said insulating layer.

4. The method of manufacturing a semiconductor junction element as set forth in claim 3, wherein:
　said forming said ferromagnetic n-type semiconductor layer is carried out under such condition that said substrate is in a temperature range of from 833 K to 1053 K.

* * * * *